(12) United States Patent
Miki

(10) Patent No.: US 11,070,220 B2
(45) Date of Patent: Jul. 20, 2021

(54) CORRECTION DEVICE FOR A/D CONVERTER AND A/D CONVERSION DEVICE

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventor: Atsushi Miki, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 17/042,463

(22) PCT Filed: Mar. 7, 2019

(86) PCT No.: PCT/JP2019/009046
§ 371 (c)(1),
(2) Date: Sep. 28, 2020

(87) PCT Pub. No.: WO2019/188085
PCT Pub. Date: Oct. 3, 2019

(65) Prior Publication Data
US 2021/0028790 A1 Jan. 28, 2021

(30) Foreign Application Priority Data
Mar. 28, 2018 (JP) .............................. JP2018-062394

(51) Int. Cl.
*H03M 1/06* (2006.01)
(52) U.S. Cl.
CPC .................................. *H03M 1/0604* (2013.01)

(58) Field of Classification Search
CPC .. H03M 1/0604; H03M 1/0678; H03M 1/069; H03M 1/0697; H03M 1/188
See application file for complete search history.

(56) References Cited

U.S. PATENT DOCUMENTS 10,784,882 B2 * 9/2020 Kang ................... H03M 1/0624
10,826,516 B2 * 11/2020 Lee ..................... H03M 1/1038
(Continued)

FOREIGN PATENT DOCUMENTS

JP          H4-178025 A      6/1992
JP          2000-114967 A    4/2000
(Continued)

OTHER PUBLICATIONS

International Search Report, Application No. PCT/JP2019/009046, dated Jun. 4, 2019. ISA/Japan Patent Office.

*Primary Examiner* — Brian K Young
(74) *Attorney, Agent, or Firm* — Honigman LLP

(57) ABSTRACT

The value range for which an error in a digital signal can be corrected is expanded. A control unit generates characteristic information indicating the relationship between an input and an output of an A/D converter and sets a value range. The control unit, in a case in which a value indicated by a first digital signal obtained by the A/D converter converting a first analog voltage signal is within the value range, A/D converts the first analog voltage signal and generates corrected digital information on the basis of the first digital signal and characteristic information, and in a case in which a value indicated by the first digital signal is not within the value range, A/D converts the first analog voltage signal and generates corrected digital information on the basis of a second digital signal obtained by the A/D converter converting the second analog voltage signal and characteristic information.

12 Claims, 7 Drawing Sheets

(56) References Cited

U.S. PATENT DOCUMENTS 10,862,498 B1 * 12/2020 Chen .................. H03M 1/462
2008/0238738 A1    10/2008 Honda et al.

FOREIGN PATENT DOCUMENTS

JP   2005-244771 A   9/2005
JP   2008-131298 A   6/2008

* cited by examiner

CORRECTION DEVICE FOR A/D CONVERTER AND A/D CONVERSION DEVICE

CROSS-REFERENCE TO RELATED APPLICATIONS

This application is the U.S. national stage of PCT/JP2019/009046 filed on Mar. 7, 2019, which claims priority of Japanese Patent Application No. JP 2018-062394 filed on Mar. 28, 2018, the contents of which are incorporated herein.

TECHNICAL FIELD

The present disclosure relates to a correction device for an A/D converter and an A/D conversion device.

BACKGROUND

A known A/D converter converts an input analog voltage signal to a digital signal and outputs the digital signal. Such an A/D converter may produce conversion results with an error due to temperature changes, deterioration over time, and the like. For example, when looking at the relationship between a value indicated by the analog voltage signal before conversion and a value indicated by the digital signal after conversion represented as a linear function, errors such as a gain error, which is the deviation of the slope from the ideal conversion result, and an offset error, which is the intercept differing from the ideal output, may be found. An example of a method for correcting such errors is described in JP 2005-244771A.

In the correction method according to JP 2005-244771A, first, a linear function Y is found that represents the relationship between a value indicated by an analog voltage signal before conversion and a value indicated by a digital signal after conversion, where $Y=\alpha X+\beta$. Specifically, a 0 V analog voltage signal is input to the A/D converter and a value indicated by the converted digital signal is defined as intercept $\beta$. Then, a reference voltage signal indicating a predetermined analog voltage value is input, and slope $\alpha$ is calculated by substituting in for X an analog voltage value indicated by the reference voltage signal and substituting in for Y a value indicated by the digital signal of the converted reference voltage signal. By using the linear function calculated in this way and a pre-stored linear function based on an ideal conversion result, a value indicated by a digital signal with an error is corrected to a theoretical value.

However, the correction method described above cannot correct a digital signal with an error to a theoretical value in some cases. For example, in the case in which a 0 to 5 V voltage value indicated by an analog voltage signal is converted to a 10-bit (0 to 1023) digital signal, the error may result in the digital signal being outside of the 10-bit range. In this case, the signal is converted to a digital signal indicating the lower limit value or the upper limit value. For example, when an intercept is negatively offset by an offset error, an analog voltage signal of 0 V should be converted to a digital signal with a negative value. However, conversion to a digital signal with a negative value is not possible, and the signal is converted to a digital signal indicating the lower limit value (0). With a digital signal output indicating the lower limit value or the upper limit value due to the signal being outside of the 10-bit range, the linear function described above between the digital signal and the analog voltage signal before conversion cannot be established and the digital signal cannot be corrected to the theoretical value.

The present disclosure was made in light of issues in the related art, and an objective of the present disclosure is to provide a solution by providing technology capable of expanding the value range for which an error in a digital signal can be corrected.

SUMMARY

A correction device for an A/D converter according to a first aspect of the present disclosure is a correction device for an A/D converter that converts an input analog voltage signal to a digital signal and outputs the digital signal. The correction device includes a reference voltage generation unit configured to generate a plurality of reference voltage signals indicating a plurality of different analog voltage values; and a signal input unit configure to input, to the A/D converter, a first analog voltage signal indicating a value of an analog voltage applied to a predetermined signal line and a second analog voltage signal, which is the value of the analog voltage applied to the signal line inverted by a predetermined inversion method. A value range setting unit is configured to set a value range on the basis of a conversion result of the plurality of reference voltage signals converted at the A/D converter; and a correction unit configured to, in a case in which a value indicated by a first digital signal obtained by the A/D converter converting the first analog voltage signal is within the value range, A/D convert the first analog voltage signal and to generate corrected digital information on the basis of the first digital signal and the conversion result of the plurality of reference voltage signals converted at the A/D converter, and in a case in which the value indicated by the first digital signal is not within the value range, A/D convert the first analog voltage signal and to generate corrected digital information on the basis of a second digital signal obtained by the A/D converter converting the second analog voltage signal and the conversion result of the plurality of reference voltage signals converted at the A/D converter.

A correction device for an A/D converter according to a second aspect of the present disclosure is a correction device for an A/D converter that converts an input analog voltage signal to a digital signal and outputs the digital signal, the correction device comprising: a reference voltage generation unit configured to generate a plurality of reference voltage signals indicating a plurality of different analog voltage values; a signal input unit configured to input, to the A/D converter, a first analog voltage signal indicating a value of an analog voltage applied to a predetermined signal line and a second analog voltage signal, which is the value of the analog voltage applied to the signal line inverted by a predetermined inversion method; and a correction unit configured to, in a case in which a value indicated by a first digital signal obtained by the A/D converter converting the first analog voltage signal is within a predetermined value range, A/D convert the first analog voltage signal and to generate corrected digital information on the basis of the first digital signal and the conversion result of the plurality of reference voltage signals converted at the A/D converter, and in a case in which the value indicated by the first digital signal is not within the value range, A/D convert the first analog voltage signal and to generate corrected digital information on the basis of a second digital signal obtained by the A/D converter converting the second analog voltage signal and the conversion result of the plurality of reference voltage signals converted at the A/D converter.

An A/D conversion device according to a third aspect of the present disclosure comprises the A/D converter; and the correction device for an A/D converter according to the first aspect or the second aspect.

Advantageous Effects of Disclosure

According to the correction device for an A/D converter according to the first aspect of the present disclosure and the correction device for an A/D converter according to the second aspect, in the case in which the value indicated by the first digital signal is within the set value range, the first analog voltage signal can be A/D converted and corrected digital information can generated on the basis of the first digital signal and the conversion result of the plurality of reference voltage signals converted at the A/D converter. Also, in the case in which the value indicated by the first digital signal is not within the set value range, the first analog voltage signal can be A/D converted and corrected digital information can be generated on the basis of the second digital signal and the conversion result of the plurality of reference voltage signals converted at the A/D converter, the second digital signal used being the second analog voltage signal (an analog voltage signal corresponding to the value of the analog voltage signal inverted by a predetermined inversion method) converted at the A/D converter.

Thus, even in the case in which the value indicated by the first digital signal is not within the value range and the first analog voltage signal cannot be accurately A/D converted, by instead A/D converting the second digital signal, the first analog voltage signal can be A/D converted and corrected digital information can be generated. Thus, the range of the first analog voltage from which a digital signal can be obtained via A/D converting and correction can be expanded.

According to the A/D conversion device according to the third aspect of the present invention, the same effect as that of the correction device for an A/D converter according to the first aspect or the second aspect can be achieved.

DETAILED DESCRIPTION OF PREFERRED EMBODIMENTS

Figure 1:
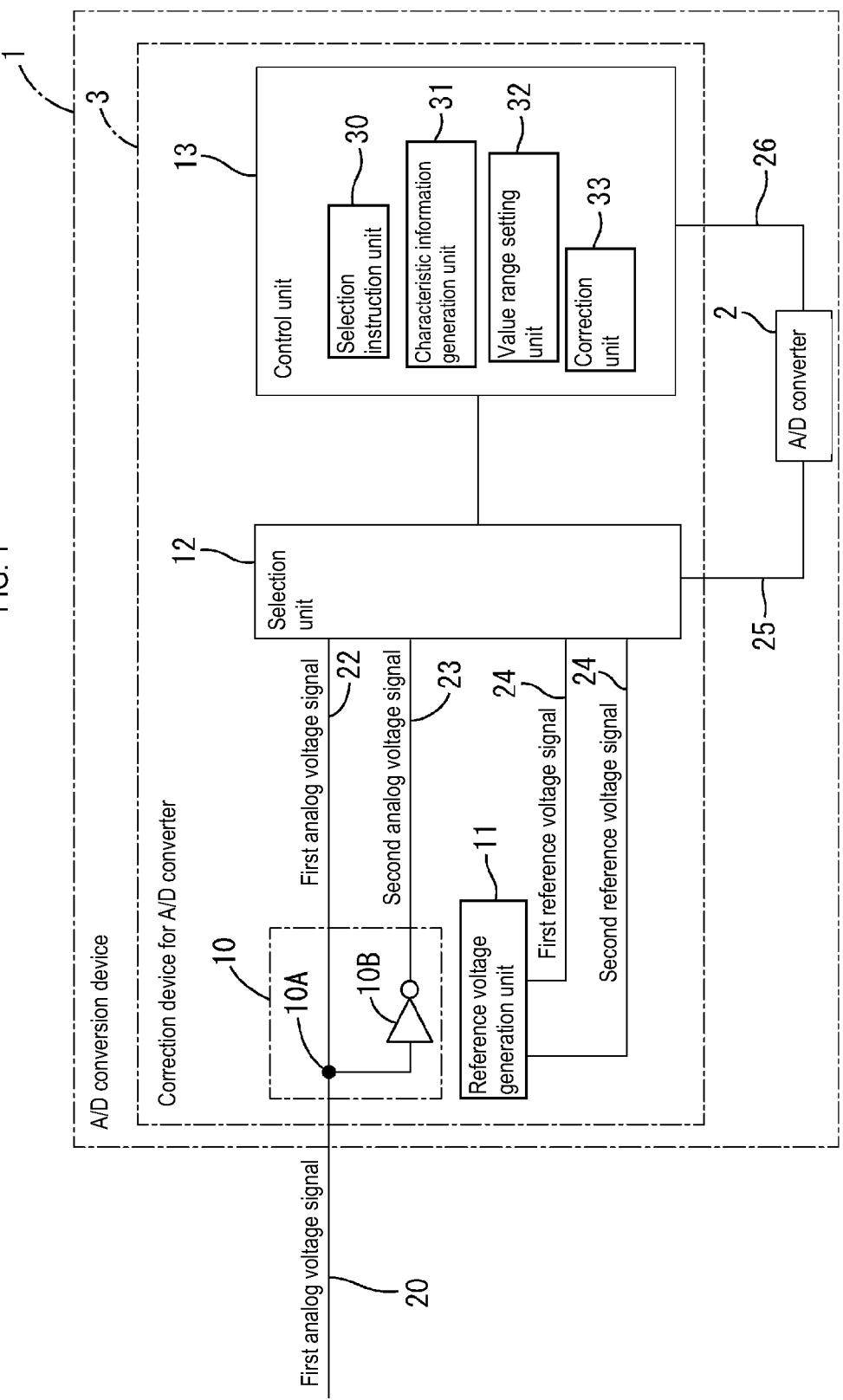
FIG. 1 is a block diagram illustrating the configuration of an A/D conversion device of a first embodiment.

Any one of the first to third aspects may further comprise a characteristic information generation unit that generate characteristic information indicating the relationship between the input and the output of the A/D converter on the basis of the conversion result of the plurality of reference voltage signals converted at the A/D converter. The correction unit, in a case in which a value indicated by a first digital signal is within the value range, may A/D convert the first analog voltage signal and generates corrected digital information on the basis of the first digital signal and characteristic information, and in a case in which a value indicated by the first digital signal is not within the value range, may A/D convert the first analog voltage signal and generates corrected digital information on the basis of the second digital signal and characteristic information.

In this way, characteristic information can be generated on the basis of the conversion result of the plurality of reference voltage signals converted at the A/D converter and the actual relationship between the input and the output of the A/D converter can be identified. Then, in the case in which the value indicated by the first digital signal is within the value range, the first analog voltage signal is A/D converted and corrected digital information is generated on the basis of the first digital signal and the characteristic information. This allows the first analog voltage signal to be more accurately A/D converted taking into consideration the actual characteristics of the A/D converter. Also, in the case in which the value indicated by the first digital signal is not within the value range, the first analog voltage signal is A/D converted and corrected digital information is generated on the basis of the second digital signal and the characteristic information. This allows the first analog voltage signal to be more accurately A/D converted taking into consideration the actual characteristics of the A/D converter even when using the first analog voltage signal directly is difficult.

The characteristic information generation unit, as the characteristic information, may generate first characteristic information, which is the relationship between a value indicated by the first analog voltage signal and the value indicated by the first digital signal represented as a function, and second characteristic information, which is the relationship between the value indicated by the first analog voltage signal and a value indicated by the second digital signal represented as a function. Also, the correction unit, in a case in which the value indicated by the first digital signal is within the value range, may generate digital information on the basis of the first digital signal and the first characteristic information, and in a case in which the value indicated by the first digital signal is not within the value range, may generate digital information on the basis of the second digital signal and the second characteristic information.

In this way, digital information can be generated in a regular manner on the basis of the first characteristic information and the second characteristic information. This allows the process for generating digital information to be simplified.

The first characteristic information may be a relationship between the value indicated by the first analog voltage signal and the value indicated by the first digital signal represented as a linear function on the basis of the conversion result of two of the plurality of reference voltage signals converted at the A/D converter. Also, the second characteristic information may be a relationship between the value indicated by the first analog voltage signal and the value indicated by the second digital signal represented as a linear function on the basis of the conversion result of two of the plurality of reference voltage signals converted at the A/D converter.

In this way, the first characteristic information and the second characteristic information can be generated using two reference voltage signals.

This can prevent the configuration for generating the first characteristic information and the second characteristic information from being too complex.

First Embodiment

A first embodiment according to the present disclosure will be described below.

An A/D conversion device 1 illustrated in FIG. 1 is configured as an onboard vehicle A/D conversion device, for example, and includes an A/D converter 2 that converts an input analog voltage signal to a digital signal and outputs the digital signal and a correction device 3 for an A/D converter (hereinafter, also referred to as the correction device 3) that corrects an error that occurs in the conversion by the A/D converter 2.

The A/D converter 2 includes the function of converting a voltage value within a predetermined range (in the first embodiment, from 0 to 5 V which is also referred to below as the "conversion voltage range") indicating an analog voltage signal to a digital signal represented by a predetermined information amount (in the first embodiment, 10 bits (0 to 1023), which is also referred to below as the "conversion value range"). Note that, in the case in which the value indicated by the analog voltage signal is less than a lower limit value (0) of the predetermined range, the A/D converter 2 converts the analog voltage signal to a digital signal indicating the lower limit value (0 V). In the case in which the value indicated by the analog voltage signal is greater than an upper limit value (5 V) of the predetermined range, the A/D converter 2 converts the analog voltage signal to a digital signal indicating the upper limit value (1023).

The correction device 3 is provided with a signal input unit 10, a reference voltage generation unit 11, a selection unit 12, and a control unit 13.

The signal input unit 10 is configured as an input circuit for input of a signal from outside of the correction device 3. A first signal line 20 that extends outside of the correction device 3 is connected to the input side of the signal input unit 10. An analog voltage indicating, via a voltage value, predetermined information is applied to the first signal line 20. This predetermined information may be, for example, detection results from a sensor disposed at a predetermined position outside of the correction device 3. The signal input unit 10 is capable of receiving input of a first analog voltage signal indicating the value of the analog voltage applied to the first signal line 20. Note that the first signal line 20 corresponds to an example of "a predetermined signal line" in the present invention.

The signal input unit 10 is provided with a branched circuit 10A which is where two signal lines branch off from a signal line connected to the first signal line 20. The branched circuit 10A includes the function of outputting the first analog voltage signal to the two branched signal lines. One of the branched signal lines is connected to a second signal line 22 connected to the output side of the signal input unit 10. In this way, the first analog voltage signal is output from the second signal line 22.

The other branched signal line is connected to a third signal line 23 connected to the output side of the signal input unit 10 and is provided with an inversion circuit 10B at a position part way along the signal line. The inversion circuit 10B includes the function of generating a second analog voltage signal by inverting the first analog voltage signal via a predetermined inversion method. In the first embodiment, the predetermined inversion method used is a method in which the value of the analog voltage is inverted about a reference, a median value Vc (in the first embodiment, 2.5 V) of the conversion voltage range. Specifically, a value indicated by the first analog voltage signal is subtracted from the maximum value (5 V in the first embodiment) of the conversion voltage range to generate an inverted value. The second analog voltage signal generated in this manner is output from the third signal line 23. In other words, the signal input unit 10 is capable of outputting the first analog voltage signal and the second analog voltage signal from separate signal lines and may output them at the same time.

The reference voltage generation unit 11, for example, is configured as a plurality of regulators that generate analog voltage signals indicating a value of a predetermined analog voltage and has the function of generating a plurality of reference voltage signals indicating different analog voltage values. The reference voltage generation unit 11 is connected to a plurality of fourth signal lines 24 on its output side and is capable of outputting a plurality of reference voltage signals separately from different fourth signal lines 24 and may output them at the same time.

Specifically, the reference voltage generation unit 11 includes a first regulator capable of generating a first reference voltage signal indicating a first analog voltage value $V_1$ and a second regulator capable of generating a second reference voltage signal indicating a second analog voltage value $V_2$. The reference voltage generation unit 11 is capable of outputting the first reference voltage signal from a predetermined fourth signal line 24 from among the two fourth signal lines 24 and is capable of outputting the second reference voltage signal from the other fourth signal line 24.

The selection unit 12 is configured as a multiplexer and includes the function of selectively outputting a signal from among the plurality of input signals. The selection unit 12 is capable of receiving input of the first analog voltage signal, the second analog voltage signal, and the plurality of reference voltage signals (in the first embodiment, the first reference voltage signal and the second reference voltage signal) via the second signal line 22, the third signal line 23, and the plurality of fourth signal lines 24 connected to the input side of the selection unit 12. The selection unit 12 is capable of selectively outputting, from a fifth signal line 25 connected to the output side of the selection unit 12, the first analog voltage signal, the second analog voltage signal, and the plurality of reference voltage signals.

The A/D converter 2 is capable of receiving input, via the fifth signal line 25 connected to the input side of the A/D converter 2, of a signal selected by the selection unit 12 from among the first analog voltage signal, the second analog voltage signal, and the plurality of reference voltage signals. The A/D converter 2 is capable of outputting the converted digital signal from a sixth signal line 26 connected to the output side of the A/D converter 2.

The sixth signal line 26 is connected to the input side of the control unit 13. In this way, the signal input unit 10 is capable of receiving input of the first analog voltage signal and outputting the first analog voltage signal and the second analog voltage signal, which is the first analog voltage signal inverted by a predetermined inversion method, to the selection unit 12 (and then to the A/D converter 2 and the control unit 13). The reference voltage generation unit 11 is capable of outputting a plurality of reference voltage signals indicating different analog voltage values to the selection unit 12 (and then to the A/D converter 2 and the control unit 13). The selection unit 12 is capable of selecting the first analog voltage signal, the second analog voltage signal, or the plurality of reference voltage signals input from the signal input unit 10 or the reference voltage generation unit 11 and outputting the selected signal to the A/D converter 2. The A/D converter 2 is capable of converting to a digital signal the first analog voltage signal, the second analog voltage signal, or a reference voltage signal from among the plurality of reference voltage signals input from the selection unit 12 (from the signal input unit 10 or the reference voltage generation unit 11) and outputting the converted signal to the control unit 13.

The control unit 13 is configured as a Micro Controller Unit (MCU), for example and is provided, for example, with a computation processing unit including a Central Processing Unit (CPU) and the like, a storage unit including a ROM, a RAM, and the like. Specifically, the control unit 13 is provided with a selection instruction unit 30, a characteristic information generation unit 31, a value range setting unit 32, and a correction unit 33 as functions of the computation processing unit.

The selection instruction unit 30 instructs the selection unit 12 whether to select the first analog voltage signal, the second analog voltage signal, or a signal from among the plurality of reference voltage signals. When the selection instruction unit 30 instructs as to what selection to make, the selection unit 12 selects the signal instructed to be selected, and the selected signal is converted to a digital signal by the A/D converter 2 and input to the control unit 13.

The characteristic information generation unit 31 generates characteristic information indicating the relationship between the input and the output of the A/D converter 2 on the basis of conversion results of the plurality of reference voltage signals converted at the A/D converter 2. A method for generating characteristic information will be described in detail below in the description of the characteristic detection processing below.

The value range setting unit 32 sets the value range used in the correction of the conversion results of the A/D converter 2. The value range setting unit 32 sets the value range on the basis of the conversion results of the plurality of reference voltage signals converted at the A/D converter 2. A method for setting the value range will be described in detail below in the description of the characteristic detection processing below.

The correction unit 33 corrects the conversion result of the A/D converter 2 using the characteristic information generated by the characteristic information generation unit 31 and the value range set by the value range setting unit 32. In the correction processing for correcting the conversion result of the A/D converter 2, first, whether or not a value indicated by the digital signal (hereinafter, also referred to as the "first digital signal") obtained by the A/D converter 2 converting the first analog voltage signal is within the value range is determined. Then, in the case in which the value indicated by the first digital signal is within the value range, the first analog voltage signal is A/D converted and corrected digital information is generated on the basis of the first digital signal and the characteristic information. However, in the case in which the value indicated by the first digital signal is not within the value range, the first analog voltage signal is A/D converted and corrected digital information is generated on the basis of the digital signal (hereinafter, also referred to as the "second digital signal") obtained by the A/D converter 2 converting the second analog voltage signal and the characteristic information. The correction processing will be described in detail below.

Next, the characteristic detection processing executed by the control unit 13 will be described in detail. The characteristic detection processing is executed each time a predetermined execution condition is met. For example, with a configuration in which the control unit 13 is capable of receiving input of a signal capable of detecting when an ignition switch is switched from OFF to ON, each time the ignition switch is switched from OFF to ON, the characteristic detection processing is executed.

Figure 2:
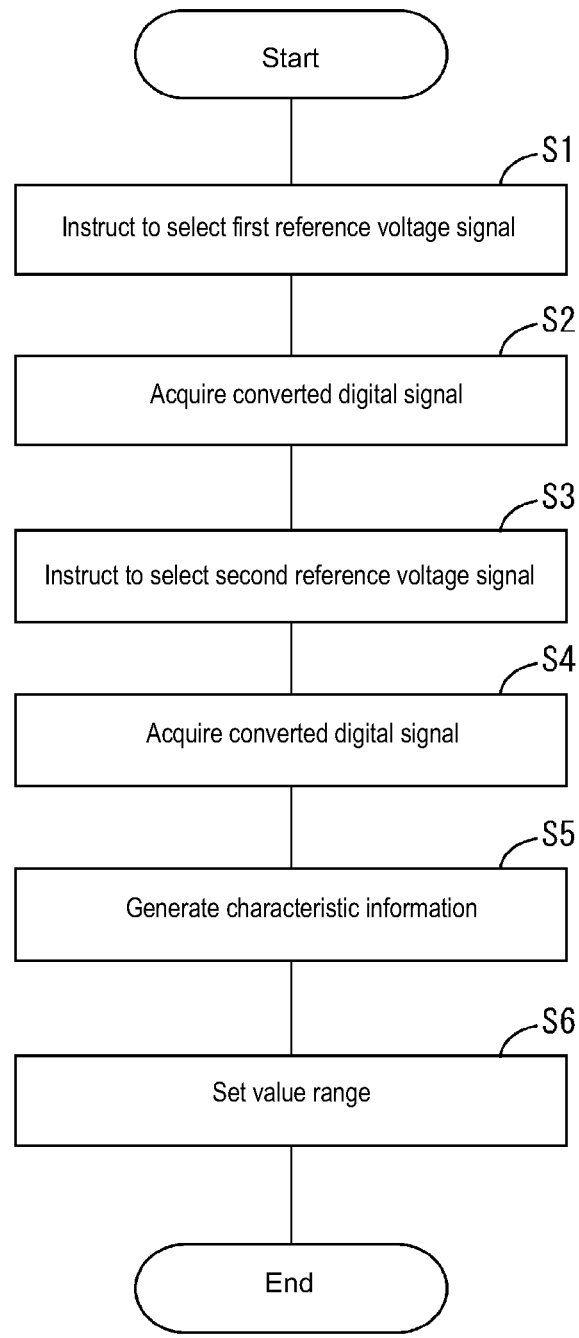
FIG. 2 is a flowchart illustrating an example of the flow of characteristic detection processing executed by the A/D conversion device.

As illustrated in FIG. 2, first, the control unit 13 instructs the selection unit 12 to select the first reference voltage signal (step S1). In this way, the first reference voltage signal is selected by the selection unit 12 and converted to a digital signal by the A/D converter 2. The control unit 13 acquires the converted digital signal (step S2).

The control unit 13 instructs the selection unit 12 to select the second reference voltage signal after the digital signal of the converted first reference voltage signal is acquired (step S3). In this way, the second reference voltage signal is selected by the selection unit 12 and converted to a digital signal by the A/D converter 2. The control unit 13 acquires the converted digital signal (step S4).

The control unit 13 generates the characteristic information described above after the digital signal of the converted first reference voltage signal and the digital signal of the converted second reference voltage signal are acquired (step S5).

Specifically, the control unit 13 generates, on the basis of the conversion results of the plurality of reference voltage signals converted at the A/D converter 2, characteristic information, (first characteristic information) which is the relationship between a value indicated by the first analog voltage signal and a value indicated by the first digital signal represented by a function. Also, the control unit 13 generates, on the basis of the conversion results of the plurality of reference voltage signals converted at the A/D converter 2, characteristic information, (second characteristic information) which is the relationship between a value indicated by the first analog voltage signal and a value indicated by the second digital signal represented by a function.

More specifically, the control unit 13 generates, on the basis of the conversion results of the two reference voltage signals (the first reference voltage signal and the second reference voltage signal) converted at the A/D converter 2, characteristic information, (first characteristic information) which is the relationship between a value indicated by the first analog voltage signal and a value indicated by the first digital signal represented by a linear function. Also, the control unit 13 generates, on the basis of the conversion results of the two reference voltage signals (the first reference voltage signal and the second reference voltage signal) converted at the A/D converter 2, characteristic information, (second characteristic information) which is the relationship between a value indicated by the first analog voltage signal and a value indicated by the second digital signal represented by a linear function.

The first characteristic information is generated as described below.

$Y_1$ indicating a value of the first digital signal is represented by $$Y_1 = \alpha_1 X_1 + \beta_1 \tag{1}$$

where $X_1$ is a value indicated by the first analog voltage signal. The slope $\alpha_1$ and the intercept $\beta_1$ of Formula (1) can be founded by acquiring two points determined by the analog voltage values indicating the two reference voltage signals input into the A/D converter 2 and the values of the digital signals of the two reference voltage signals converted by the A/D converter 2, substituting these two points into Formula (1), and solving the resulting simultaneous equations.

Figure 3:
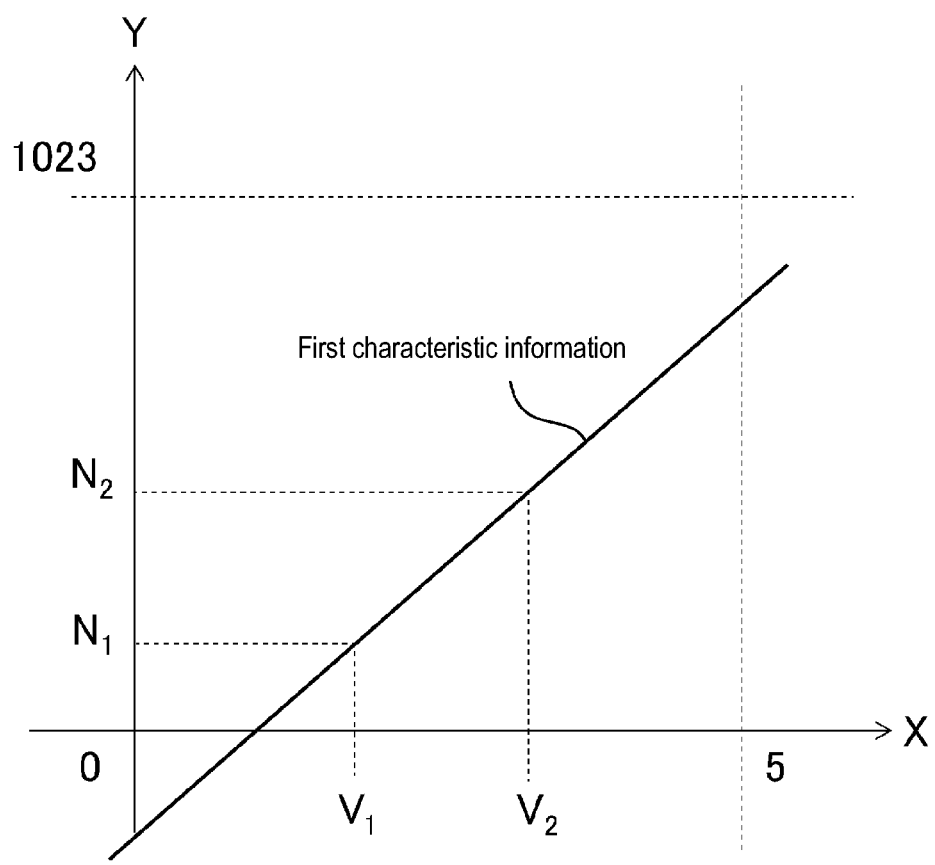
FIG. 3 is an explanatory diagram schematically illustrating an example of first characteristic information.

For example, in the example illustrated in FIG. 3, $N_1$ is a value indicated by the digital signal of the first reference voltage signal indicating an analog voltage value $V_1$ converted by the A/D converter 2, and $N_2$ is a value indicated by the digital signal of the second reference voltage signal indicating an analog voltage value $V_2$ converted by the A/D converter 2. In this example, the voltage values $V_1$, $V_2$ indicated by the first reference voltage signal and the second reference voltage signal are substituted for $X_1$ in Formula (1), and the values $N_1$, $N_2$ indicated by the digital signals of the first reference voltage signal and the second reference voltage signal converted by the A/D converter 2 are substituted for $Y_1$. By solving the simultaneous equations arrived at after substitution, $\alpha_1 = \alpha$, $\beta_1 = \beta$ can be found. Substituting $\alpha$ for $\alpha_1$ in Formula (1) and $\beta$ for $\beta_1$ gives:

$$Y_1 = \alpha X_1 + \beta \quad (2).$$

Formula (2) corresponds to an example of "first characteristic information" of the present invention. The control unit 13 stores the first characteristic information generated in this manner in the storage unit.

The second characteristic information is generated as described below.

Figure 4:
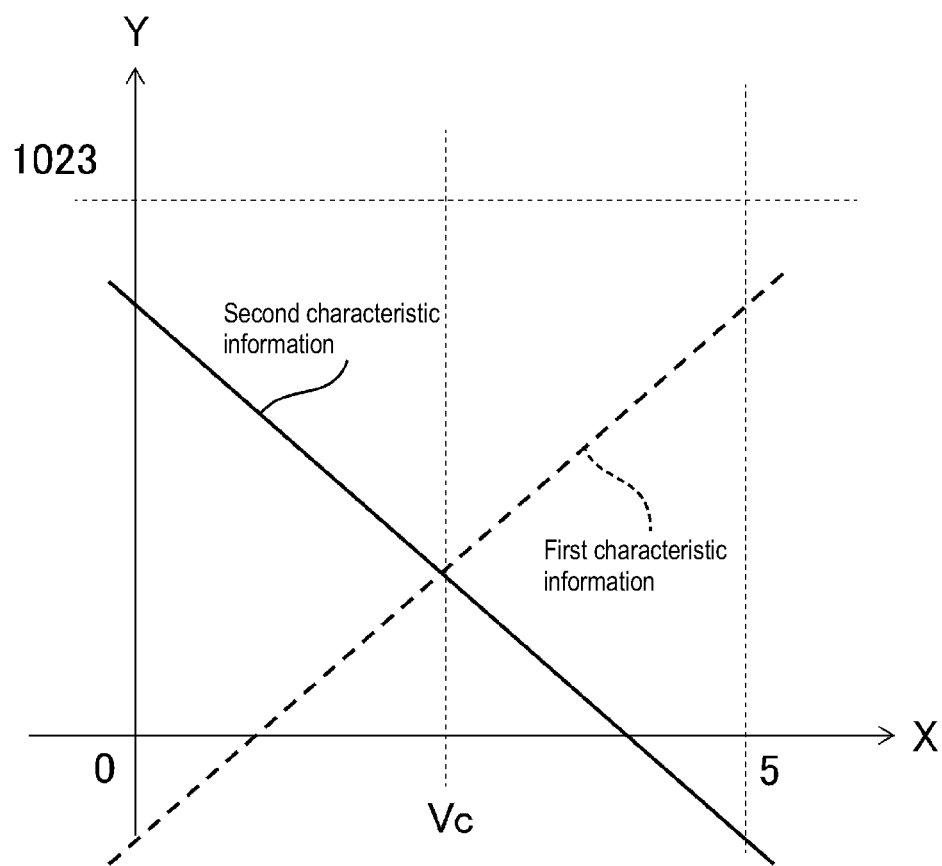
FIG. 4 is an explanatory diagram schematically illustrating an example of second characteristic information.

$Y_2$ indicating a value of the second digital signal is represented by $$Y_2 = \beta_2 X_2 + \beta_2 \quad (3)$$

where $X_2$ is a value indicated by the second analog voltage signal. $X_2$ is a value indicated by $X_1$ inverted about a reference, the median value Vc (2.5 V) of the conversion voltage range. Accordingly, as illustrated in FIG. 4, Formula (3) is linearly symmetrical to Formula (2) with respect to an axis X=Vc. Thus, $\alpha_2 = -\alpha_1 = -\alpha$. Also, $\beta_2$ corresponds to $Y_1$ of Formula (2) when $X_1$ is the upper limit value (5.0 V) of the conversion voltage range. Thus, $\beta_2 = 5\alpha + \beta$. Substituting $-\alpha$ for $\alpha_2$ in Formula (3) and $5\alpha + \beta$ for $\beta_2$ gives:

$$Y_2 = \alpha X_2 + 5\alpha + \beta \quad (4).$$

Formula (4) corresponds to an example of "second characteristic information" of the present invention. The control unit 13 stores the second characteristic information generated in this manner in the storage unit.

After the characteristic information is generated, the control unit 13 sets the value range (step S6). In the case in which a predetermined exclusion condition is contained in the characteristic information, the control unit 13 sets the conversion value range as the value range. The following are two exclusion conditions.

A first exclusion condition is $Y_1$ being less than the lower limit value (0) of the conversion value range, when the lower limit value (0 in the first embodiment) of the conversion voltage range is substituted for $X_1$ of the first characteristic information (Formula (2)). In a case corresponding to the first exclusion condition, the conversion value range excluding the lower limit value (0) of the conversion value range or a predetermined error range (for example, from 0 to 9) including the lower limit value (0) of the conversion value range is set as the value range.

A second exclusion condition is $Y_1$ being greater than the upper limit value (1023 in the first embodiment) of the conversion value range, when the upper limit value (5 in the first embodiment) of the conversion voltage range is substituted for $X_1$ of the first characteristic information (Formula (2)). In a case corresponding to the second exclusion condition, the conversion value range excluding the upper limit value (1023) of the conversion value range or a predetermined error range (for example, from 1014 to 1023) including the upper limit value (1023) of the conversion value range is set as the value range.

In a case corresponding to both the first exclusion condition and the second exclusion condition, the conversion value range excluding the lower limit value (0) of the conversion value range or a predetermined error range (for example, from 0 to 9) including the lower limit value (0) of the conversion value range and excluding the upper limit value (1023) of the conversion value range or a predetermined error range (for example, from 1014 to 1023) including the upper limit value of the conversion value range is set as the value range.

Next, the correction processing executed by the control unit 13 will be described.

The control unit 13 executes correction processing to, as described above, correct the conversion result of the A/D converter 2 on the basis of the characteristic information generated by the characteristic information generation unit 31 and the value information set by the value range setting unit 32. The correction processing is executed when a predetermined execution condition is met. For example, with a configuration in which the control unit 13 inputs a signal capable of detecting when an ignition switch is ON, each time a predetermined amount of time passes with the ignition switch in an ON state, the correction processing may be executed.

Figure 5:
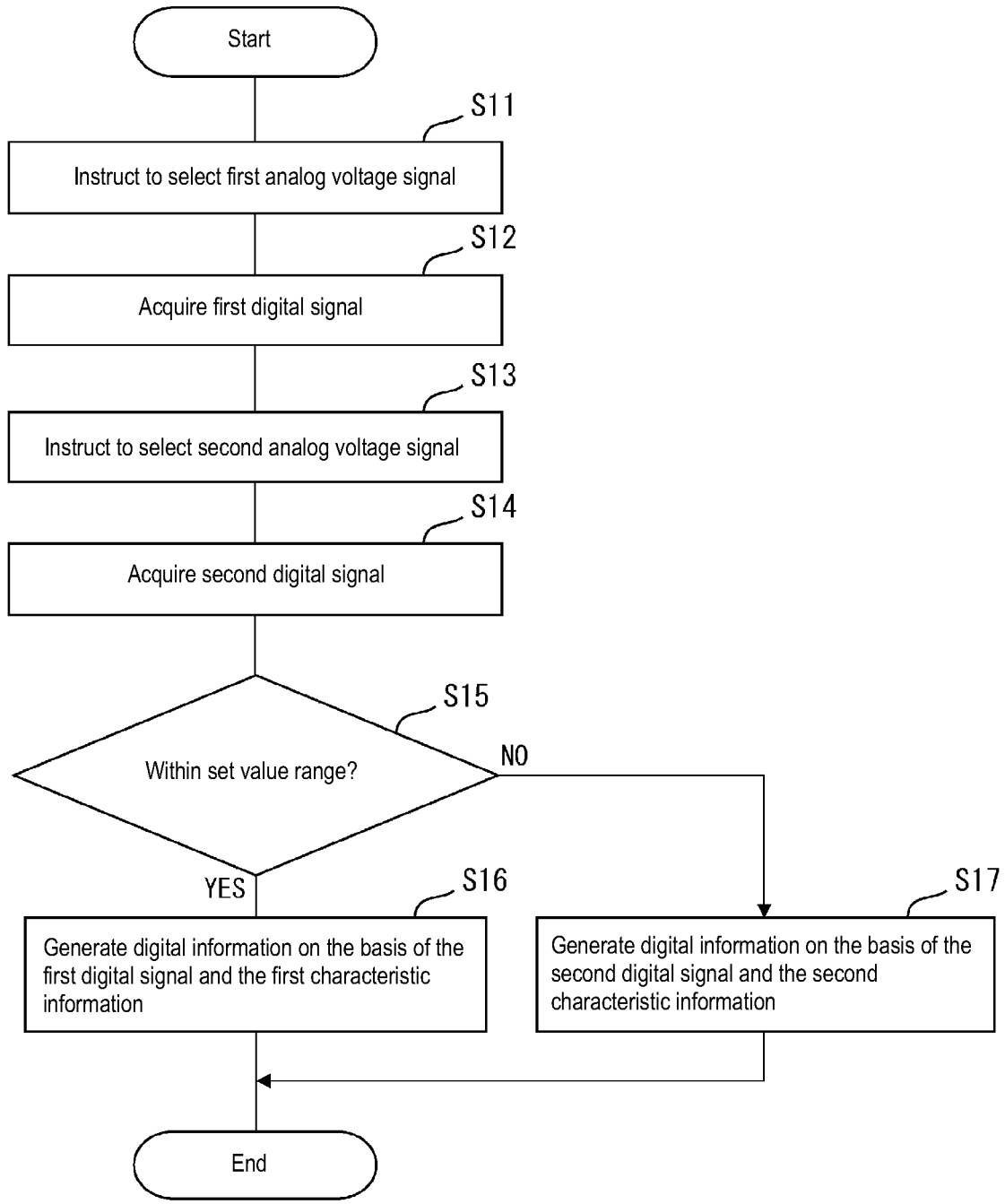
FIG. 5 is a flowchart illustrating an example of the flow of correction processing executed by the A/D conversion device.

As illustrated in FIG. 5, in the correction processing, first, the selection unit 12 is instructed to select the first analog voltage signal (step S11). In this way, the first analog voltage signal is selected by the selection unit 12 and converted to the first digital signal by the A/D converter 2. The control unit 13 acquires the first digital signal (step S12). The selection unit 12 is instructed to select the second analog voltage signal after the first digital signal is acquired (step S13). In this way, the second analog voltage signal is selected by the selection unit 12 and converted to the second digital signal by the A/D converter 2. The control unit 13 acquires the second digital signal (step S14).

Figure 6:
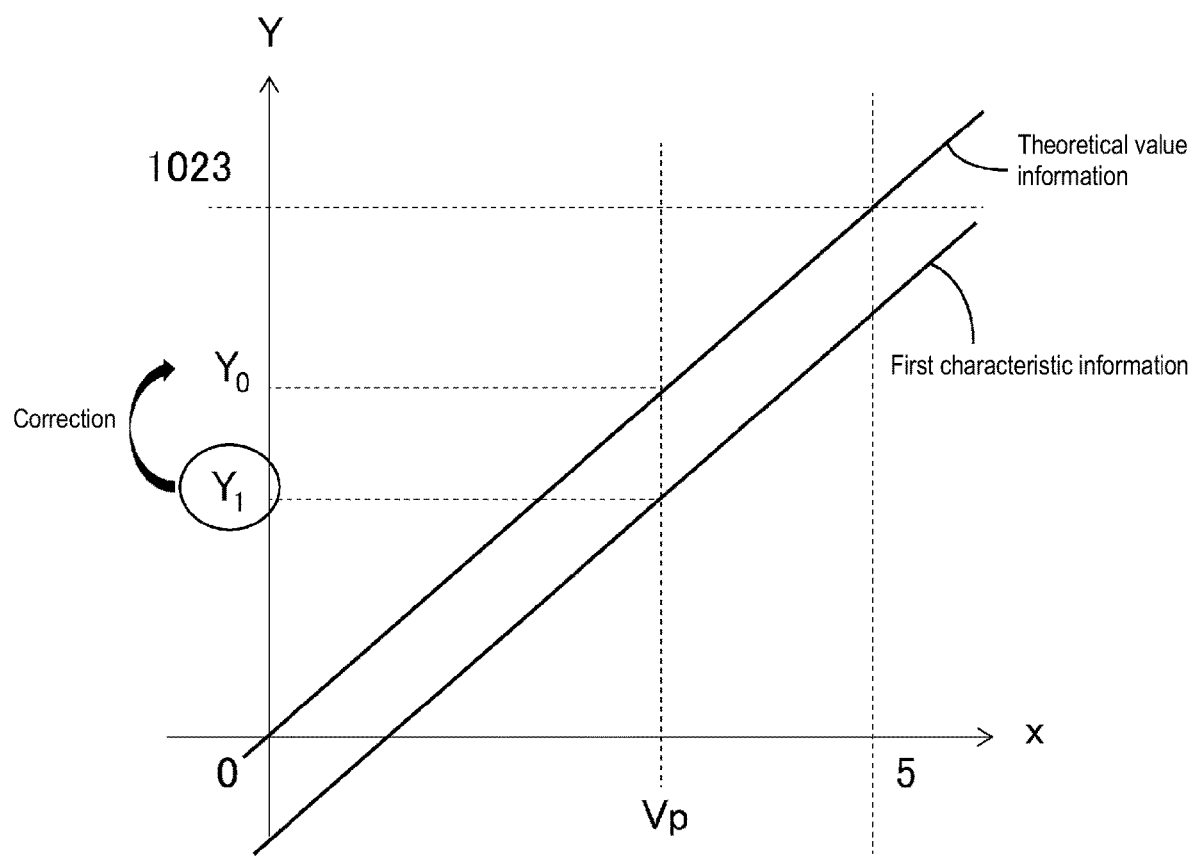
FIG. 6 is an explanatory diagram schematically illustrating a correction mode in the case in which a value indicated by a first digital signal is within a conversion value range.

After the first digital signal and the second digital signal are acquired, the control unit 13 determines whether or not the value indicated by the first digital signal is within the value range (step S15). Then, in the case in which the value is determined to be within the value range (YES in step S15), the first analog voltage signal is A/D converted and corrected digital information is generated on the basis of the first digital signal and the characteristic information (the first characteristic information) (step S16). For example, as illustrated in FIG. 6, in the case in which the analog voltage value indicated by the first analog voltage signal is Vp, the value indicated by the first digital signal is determined to be within the value range. In this way, digital information is generated on the basis of the first digital signal and the first characteristic information.

In generating the digital information, first, the first characteristic information and the pre-stored theoretical value information are read out from the storage unit.

Here, theoretical value information refers to information indicating the relationship between the voltage value of an analog voltage signal input into the A/D converter 2 and the value indicated by an ideal digital signal of the analog voltage signal converted by the A/D converter 2. In the first embodiment, theoretical value information is represented by a linear function. In the first embodiment, an analog voltage signal of from 0 to 5 V is converted to a 10-bit (0 to 1023) digital signal. Thus, the theoretical value information corresponds to $$Y_0 = (1023/5) \times X_0 \quad (5).$$

Note that the theoretical value information may be stored in advance in the storage unit prior to product delivery or may be generated on the basis of actually measured value after product delivery and stored in the storage unit.

After the first characteristic information (Formula (3)) and the theoretical value information (Formula (5)) are read out, the control unit 13 solves for $Y_0$ as described below. $X_0=X_1=Vp$, where Vp is the value indicated by the first analog voltage signal. Also, $Y_1$ corresponds to the value indicated by the first digital signal input to the control unit 13. By substituting these values into Formula (3) and Formula (5), $Y_0$ can be solved. $Y_0$ is a correction value and corresponds to an example of "digital information" in the present invention.

In the case in which the value indicated by the first digital signal is determined to not be within the set value range (NO in step S15 of FIG. 5), the second digital signal is used instead of the first digital signal. This is because in the case in which the first digital signal is not within the value range, the second digital signal, which is the first analog voltage signal inverted then A/D converted, can be used to obtain a value within the value range. Then, the control unit 13 A/D converts the first analog voltage signal and generates corrected digital information on the basis of the second digital signal and the characteristic information (the second characteristic information) (step S17).

Figure 7:
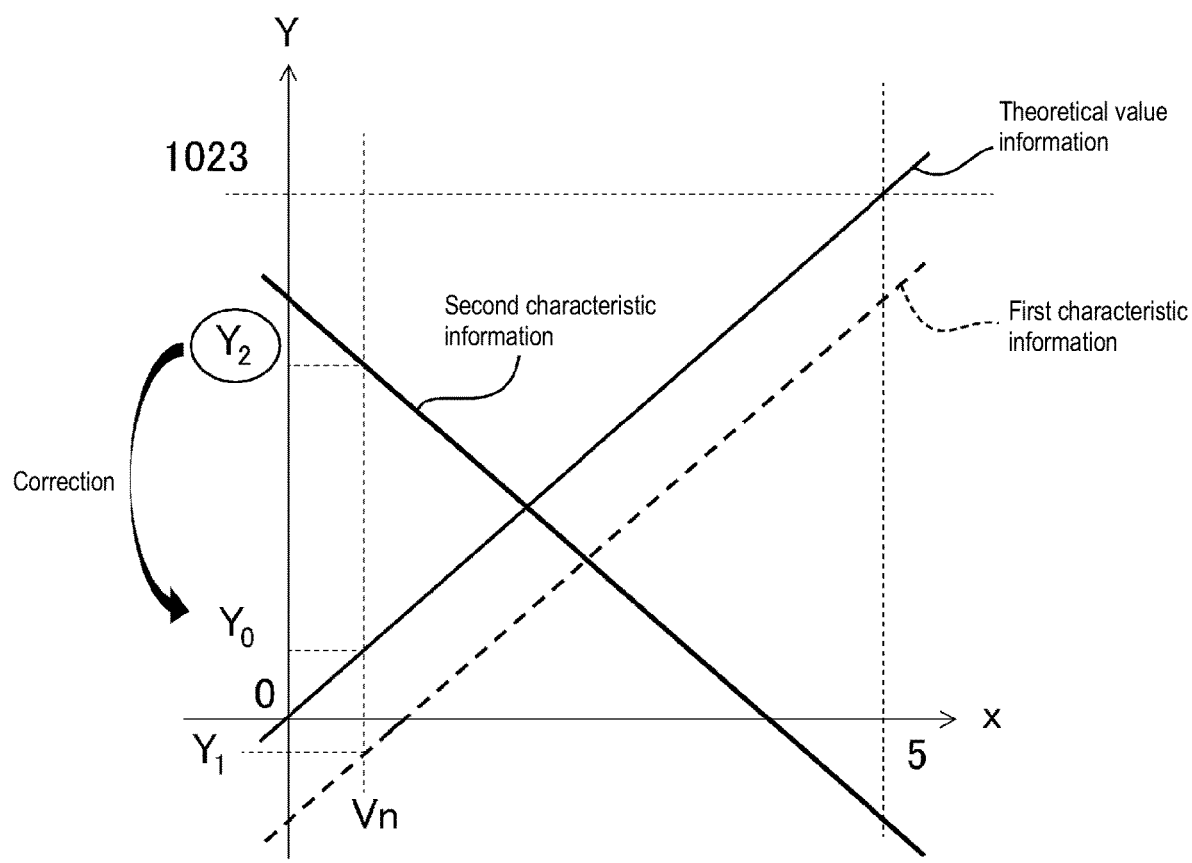
FIG. 7 is an explanatory diagram schematically illustrating a correction mode in the case in which a value indicated by a first digital signal is not within a conversion value range.

For example, as illustrated in FIG. 7, in the case in which the analog voltage value indicated by the first analog voltage signal is Vn, the value indicated by the first digital signal is 0, and this is determined to be not within the value range. However, the value indicated by the second digital signal is within the value range. It is for this reason that the first analog voltage signal is A/D converted and corrected digital information is generated on the basis of the second digital signal and the characteristic information (the second characteristic information).

After the first characteristic information (Formula (4)) and the theoretical value information (Formula (5)) are read out, the control unit 13 solves for $Y_0$ as described below. $X_0=X_2=Vn$, where Vn is the value indicated by the first analog voltage signal. Also, $Y_2$ corresponds to the value indicated by the second digital signal input to the control unit 13. By substituting these values into Formula (4) and Formula (5), $Y_0$ can be solved. $Y_0$ is a correction value and corresponds to an example of "digital information" in the present invention.

As described above, the correction device 3 for an A/D converter of the first embodiment converts an input analog voltage signal to a digital signal and outputs the digital signal and comprises the reference voltage generation unit 11 that generates a plurality of reference voltage signals indicating a plurality of different analog voltage values; the characteristic information generation unit 31 that generates characteristic information indicating the relationship between the input and the output of the A/D converter 2 and characteristic information on the basis of the conversion result of the plurality of reference voltage signal converted at the A/D converter 2; the value range setting unit 32 that sets the value range on the basis of the conversion result of the plurality of reference voltage signals converted at the A/D converter 2; the signal input unit 10 that inputs, to the A/D converter 2, a first analog voltage signal indicating a value of an analog voltage applied to the first signal line 20 and a second analog voltage signal, which is the value of the analog voltage applied to the first signal line 20 inverted by a predetermined inversion method; and the correction unit 33 that, in a case in which a value indicated by a first digital signal obtained by the A/D converter 2 converting the first analog voltage signal is within the value range, A/D converts the first analog voltage signal and generates corrected digital information on the basis of the first digital signal and the characteristic information, and in a case in which the value indicated by the first digital signal is not within the value range, A/D converts the first analog voltage signal and generates corrected digital information on the basis of a second digital signal obtained by the A/D converter 2 converting the second analog voltage signal and the characteristic information.

According to the correction device 3 for an A/D converter of the first embodiment, as with conventional technology, in the case in which the value indicated by the first digital signal is within the value range, the first analog voltage signal can be A/D converted and corrected digital information can be generated on the basis of the first digital signal and the characteristic information. Also, even in the case in which the value indicated by the first digital signal is not within the value range, a signal obtained by inverting the first analog voltage signal by a predetermined inversion method then A/D converting can be used to obtain a value within the value range. Thus, even in the case in which the value indicated by the first digital signal is not within the value range, by using the second digital signal obtained by inverting and converting and the characteristic information, the first analog voltage signal can be A/D converted and corrected digital information can be generated. In this way, the value range for which an error in the first digital signal can be corrected can be expanded.

In the correction device 3 for an A/D converter of the first embodiment, the characteristic information generation unit 31, as the characteristic information, generates first characteristic information, which is the relationship between a value indicated by the first analog voltage signal and the value indicated by the first digital signal represented as a function, and second characteristic information, which is the relationship between the value indicated by the first analog voltage signal and a value indicated by the second digital signal represented as a function. The correction unit 33, in a case in which the value indicated by the first digital signal is within the value range, generates the digital information on the basis of the first digital signal and the first characteristic information, and in a case in which the value indicated by the first digital signal is not within the value range, generates the digital information on the basis of the second digital signal and the second characteristic information.

In this way, digital information can be generated in a regular manner on the basis of the first characteristic information and the second characteristic information. This allows the process for generating digital information to be simplified.

Also, in the correction device 3 for an A/D converter of the first embodiment, the first characteristic information is the relationship between the value indicated by the first analog voltage signal and the value indicated by the first digital signal represented as a linear function on the basis of a conversion result of two of the plurality of reference voltage signals converted at the A/D converter 2. The second characteristic information is a relationship between the value indicated by the first analog voltage signal and the value indicated by the second digital signal represented as a linear function on the basis of the conversion result of two of the plurality of reference voltage signals converted at the A/D converter 2.

In this way, the first characteristic information and the second characteristic information can be generated using two reference voltage signals. This can prevent the configuration for generating the first characteristic information and the second characteristic information from being too complex.

The A/D conversion device 1 of the first embodiment is provided with the A/D converter 2 and the correction device 3 for an A/D converter. In this way, the effects obtained by the A/D converter 2 described above can be achieved. Also, the A/D conversion device 1 can be formed as a single unit including the A/D converter 2.

Other Embodiments

The present disclosure is not limited to the embodiments described above with reference to the drawings, and, for example, the following embodiments are also included in the technical scope of the present invention.
1. In the first embodiment described above, the value range is set by the value range setting unit. However, a predetermined value range may be stored in the storage unit. In this case, compared to when the value range is set on the basis of actual data, the complexity of the program can be reduced and the processing load for setting the value range can be reduced.
2. In the first embodiment described above, two reference voltage signals are used. However, three or more may be used.
3. In the first embodiment described above, when the control unit instructs the selection unit to select the reference voltage signal, the selection instructions are in order from the first reference voltage signal. However, the selection instructions may be in any order.
4. In the first embodiment described above, when the control unit instructs the selection unit to select the first analog voltage signal and the second analog voltage signal, the selection instructions are in order from the first analog voltage signal. However, the selection instructions may be in any order.

The invention claimed is:

1. A correction device for an A/D converter that converts an input analog voltage signal to a digital signal and outputs the digital signal, the correction device comprising:
   a reference voltage generation unit configured to generate a plurality of reference voltage signals indicating a plurality of different analog voltage values;
   a signal input unit configured to input, to the A/D converter, a first analog voltage signal indicating a value of an analog voltage applied to a predetermined signal line and a second analog voltage signal, which is the value of the analog voltage applied to the signal line inverted by a predetermined inversion method;
   a value range setting unit configured to set a value range on the basis of a conversion result of the plurality of reference voltage signals converted at the A/D converter; and
   a correction unit configured to,
   in a case in which a value indicated by a first digital signal obtained by the A/D converter converting the first analog voltage signal is within the value range, A/D convert the first analog voltage signal and to generate corrected digital information on the basis of the first digital signal and the conversion result of the plurality of reference voltage signals converted at the A/D converter, and
   in a case in which the value indicated by the first digital signal is not within the value range, A/D convert the first analog voltage signal and to generate corrected digital information on the basis of a second digital signal obtained by the A/D converter converting the second analog voltage signal and the conversion result of the plurality of reference voltage signals converted at the A/D converter.

2. A correction device for an A/D converter that converts an input analog voltage signal to a digital signal and outputs the digital signal, the correction device comprising:
   a reference voltage generation unit configured to generate a plurality of reference voltage signals indicating a plurality of different analog voltage values;
   a signal input unit configured to input, to the A/D converter, a first analog voltage signal indicating a value of an analog voltage applied to a predetermined signal line and a second analog voltage signal, which is the value of the analog voltage applied to the signal line inverted by a predetermined inversion method; and
   a correction unit configured to,
   in a case in which a value indicated by a first digital signal obtained by the A/D converter converting the first analog voltage signal is within a predetermined value range, A/D convert the first analog voltage signal and to generate corrected digital information on the basis of the first digital signal and the conversion result of the plurality of reference voltage signals converted at the A/D converter, and
   in a case in which the value indicated by the first digital signal is not within the value range, A/D convert the first analog voltage signal and to generate corrected digital information on the basis of a second digital signal obtained by the A/D converter converting the second analog voltage signal and the conversion result of the plurality of reference voltage signals converted at the A/D converter.

3. The correction device for an A/D converter according to claim 1, further comprising
   a characteristic information generation unit configured to generate characteristic information indicating a relationship between an input and an output of the A/D converter on the basis of the conversion result of the plurality of reference voltage signals converted at the A/D converter, wherein
   the correction unit,
   in a case in which the value indicated by the first digital signal is within the value range, A/D converts the first analog voltage signal and generates corrected digital information on the basis of the first digital signal and the characteristic information, and
   in a case in which the value indicated by the first digital signal is not within the value range, A/D converts the first analog voltage signal and generates corrected digital information on the basis of the second digital signal and the characteristic information.

4. The correction device for an A/D converter according to claim 3, wherein
the characteristic information generation unit generates, as the characteristic information, first characteristic information, which is a relationship between a value indicated by the first analog voltage signal and the value indicated by the first digital signal represented as a function, and second characteristic information, which is a relationship between the value indicated by the first analog voltage signal and a value indicated by the second digital signal represented as a function; and
the correction unit,
in a case in which the value indicated by the first digital signal is within the value range, generates the digital information on the basis of the first digital signal and the first characteristic information, and
in a case in which the value indicated by the first digital signal is not within the value range, generates the digital information on the basis of the second digital signal and the second characteristic information.

5. The correction device for an A/D converter according to claim 4, wherein
the first characteristic information is a relationship between the value indicated by the first analog voltage signal and the value indicated by the first digital signal represented as a linear function on the basis of a conversion result of two of the plurality of reference voltage signals converted at the A/D converter; and
the second characteristic information is a relationship between the value indicated by the first analog voltage signal and the value indicated by the second digital signal represented as a linear function on the basis of the conversion result of two of the plurality of reference voltage signals converted at the A/D converter.

6. An A/D conversion device comprising:
the A/D converter; and
the correction device for an A/D converter according to claim 1.

7. The correction device for an A/D converter according to claim 2, further comprising
a characteristic information generation unit configured to generate characteristic information indicating a relationship between an input and an output of the A/D converter on the basis of the conversion result of the plurality of reference voltage signals converted at the A/D converter, wherein
the correction unit,
in a case in which the value indicated by the first digital signal is within the value range, A/D converts the first analog voltage signal and generates corrected digital information on the basis of the first digital signal and the characteristic information, and
in a case in which the value indicated by the first digital signal is not within the value range, A/D converts the first analog voltage signal and generates corrected digital information on the basis of the second digital signal and the characteristic information.

8. An A/D conversion device comprising:
the A/D converter; and
the correction device for an A/D converter according to claim 2.

9. The A/D conversion device according to claim 6, further including a characteristic information generation unit configured to generate characteristic information indicating a relationship between an input and an output of the A/D converter on the basis of the conversion result of the plurality of reference voltage signals converted at the A/D converter, wherein
the correction unit,
in a case in which the value indicated by the first digital signal is within the value range, A/D converts the first analog voltage signal and generates corrected digital information on the basis of the first digital signal and the characteristic information, and
in a case in which the value indicated by the first digital signal is not within the value range, A/D converts the first analog voltage signal and generates corrected digital information on the basis of the second digital signal and the characteristic information.

10. The A/D conversion device according to claim 8, further including a characteristic information generation unit configured to generate characteristic information indicating a relationship between an input and an output of the A/D converter on the basis of the conversion result of the plurality of reference voltage signals converted at the A/D converter, wherein
the correction unit,
in a case in which the value indicated by the first digital signal is within the value range, A/D converts the first analog voltage signal and generates corrected digital information on the basis of the first digital signal and the characteristic information, and
in a case in which the value indicated by the first digital signal is not within the value range, A/D converts the first analog voltage signal and generates corrected digital information on the basis of the second digital signal and the characteristic information.

11. The A/D conversion device according to claim 10, wherein the characteristic information generation unit generates, as the characteristic information, first characteristic information, which is a relationship between a value indicated by the first analog voltage signal and the value indicated by the first digital signal represented as a function, and second characteristic information, which is a relationship between the value indicated by the first analog voltage signal and a value indicated by the second digital signal represented as a function; and
the correction unit,
in a case in which the value indicated by the first digital signal is within the value range, generates the digital information on the basis of the first digital signal and the first characteristic information, and
in a case in which the value indicated by the first digital signal is not within the value range, generates the digital information on the basis of the second digital signal and the second characteristic information.

12. The A/D conversion device according to claim 11 wherein the first characteristic information is a relationship between the value indicated by the first analog voltage signal and the value indicated by the first digital signal represented as a linear function on the basis of a conversion result of two of the plurality of reference voltage signals converted at the A/D converter; and
the second characteristic information is a relationship between the value indicated by the first analog voltage signal and the value indicated by the second digital signal represented as a linear function on the basis of the conversion result of two of the plurality of reference voltage signals converted at the A/D converter.

* * * * *